US008513864B2

(12) United States Patent
    Ho

(10) Patent No.: US 8,513,864 B2
(45) Date of Patent: Aug. 20, 2013

(54) MICROMECHANICAL RESONATOR WITH ENLARGED PORTION

(76) Inventor: Gavin Ho, Foster City, CA (US)

( * ) Notice: Subject to any disclaimer, the term of this patent is extended or adjusted under 35 U.S.C. 154(b) by 391 days.

(21) Appl. No.: 12/904,814

(22) Filed: Oct. 14, 2010

(65) Prior Publication Data

US 2011/0089785 A1    Apr. 21, 2011

Related U.S. Application Data

(60) Provisional application No. 61/279,074, filed on Oct. 14, 2009.

(51) Int. Cl.
    *H01L 41/053* (2006.01)
(52) U.S. Cl.
    USPC .......................................... 310/351; 310/367
(58) Field of Classification Search
    USPC .................... 310/320, 348, 349, 351, 367
    See application file for complete search history.

(56) References Cited

U.S. PATENT DOCUMENTS

| | | | |
|---|---|---|---|
| 6,374,677 B1 | 4/2002 | Berlin et al. | |
| 7,005,946 B2 * | 2/2006 | Duwel et al. | 333/187 |
| 7,692,358 B2 * | 4/2010 | Kvisteroy et al. | 310/318 |
| 7,880,364 B2 * | 2/2011 | Nakamura et al. | 310/309 |
| 2003/0190776 A1 | 10/2003 | Wong et al. | |
| 2004/0058591 A1 * | 3/2004 | Avazi et al. | 439/894 |
| 2006/0125576 A1 | 6/2006 | Ho et al. | |
| 2008/0179313 A1 | 7/2008 | Vilander | |
| 2009/0153267 A1 | 6/2009 | Lutz et al. | |
| 2009/0307884 A1 * | 12/2009 | Duwel et al. | 29/25.35 |
| 2010/0060111 A1 * | 3/2010 | Ayazi et al. | 310/367 |

OTHER PUBLICATIONS

Notification of Transmittal of the International Search Report and the Written Opinion of the International Searching Authority, or the Declaration dated Dec. 6, 2010 for PCT/US2010/052699.

* cited by examiner

*Primary Examiner* — Thomas Dougherty
(74) *Attorney, Agent, or Firm* — Duane Morris LLP

(57) ABSTRACT

An apparatus with a micromechanical acoustic resonator formed on a substrate and enclosed in a cavity in the substrate. The resonator is partially suspended in the cavity. The resonator is shaped with a primary portion, and a first enlarged portion, where the primary portion is connected to the substrate, and the first enlarged portion is connected to one end of the primary portion. A capacitor connected in series to the resonator, and located external to the resonator cavity. The resonator is made of a compensating material and a piezoelectric material in between a first conductive film and a second conductive film.

19 Claims, 15 Drawing Sheets

A

B

MICROMECHANICAL RESONATOR WITH ENLARGED PORTION

RELATED APPLICATIONS

This application claims priority to U.S. Provisional Patent Application No. 61/279,074, entitled "Piezoelectric Micromechanical IBAR," filed on Oct. 14, 2009.

BACKGROUND

1. Field of the Invention

Aspects of the present invention relate in general to electrical resonators. Aspects include a substrate containing a micromechanical acoustic resonator comprising a primary portion and an enlarged portion. Additional aspects include a low-cost method of manufacturing the resonator for accurate frequency in a fixed-frequency oscillator application.

2. Description of the Related Art

An electrical network consisting of a resonator (e.g., electrical, electromechanical, and electromagnetic resonators) can be used as a frequency reference for electrical systems. A frequency reference determines the oscillation frequency in an oscillator loop by providing a stable frequency at which the phase shift in the loop is zero (or an integer multiple of $2\pi$). Considering an oscillator to have three parts; the gain stage, the feedback network, and auxiliary components; the oscillation frequency is largely determined by the phase shift in the feedback network.

Electromechanical or "acoustic" resonators are a popular choice for the feedback network because of their phase characteristics. Acoustic resonators can provide excellent frequency stability because they can attain excellent quality factor Q. A high Q provides a high gradient of phase over frequency (i.e., a sharp phase transition). Acoustic resonators are enclosed in a cavity for long-term stability and performance.

The zero-phase frequency of the oscillator is closely dependent on the resonant frequency of the network. (A resonant frequency is a frequency at which the phase shift is zero and the impedance is low. At an anti-resonant frequency, the phase shift is zero and the impedance is high.) The resonant frequency of the network is dependent on the resonant frequency of the constituent resonator.

In the activity of manufacturing the constituent resonator, variations will be observed in the resonant frequency. The extent of these variations is one culprit of high manufacturing cost. Large variations are not resolvable and reduce the manufacturing yield. Moderate variations must be reduced to acceptable tolerances through additional processing activities. Such activities are essential and costly.

SUMMARY

An apparatus includes a micromechanical acoustic resonator. The resonator is formed on the substrate and enclosed in a cavity in the substrate. The resonator is partially suspended in the cavity and is made of a piezoelectric material and a conductive material. The resonator includes a primary portion. and an enlarged portion. The primary portion is connected to the substrate, while the enlarged portion is connected to one end of the primary portion.

DETAILED DESCRIPTION

One aspect of the present invention is a high-quality resonator structure that increases ease of use, lowers cost of manufacturing, and improves reliability, performance, low power dissipation, and miniaturization. In one embodiment, a device or apparatus has a micromechanical acoustic resonator. The resonator is formed on the substrate and enclosed in a cavity in the substrate. The resonator is partially suspended in the cavity and is made of a piezoelectric material and a conductive material. The resonator may be a primary portion and an enlarged portion. The primary portion is connected to the substrate, and the enlarged portion is connected to one end of the primary portion.

Operation of embodiments of the present invention may be illustrated by example.

Figure 1:
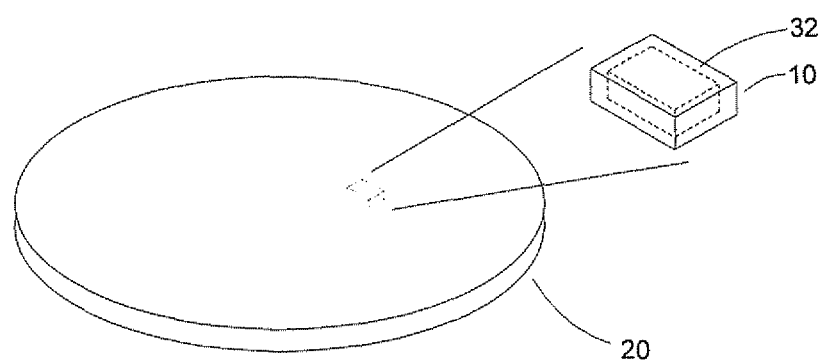
FIG. 1 depicts a method of singulating a substrate comprising an electrical network from a mother substrate.
Figure 2:
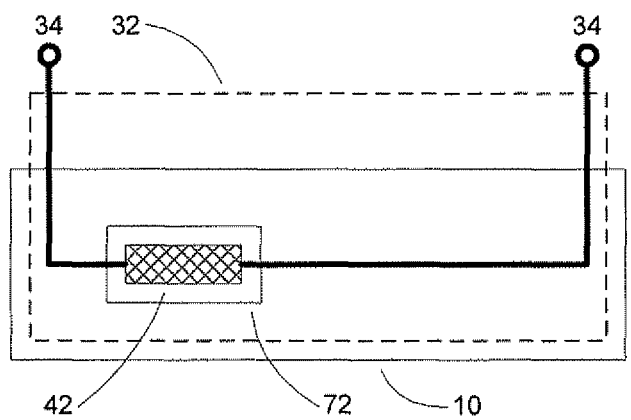
FIG. 2 illustrates a cross-sectional view of a substrate comprising an electrical network further comprising a resonator formed in a cavity in the substrate.

FIG. 1 depicts a method of singulating a substrate comprising an electrical network from a mother substrate, constructed and operative in accordance with an embodiment of the present invention. A micromechanical acoustic resonator 42 is formed on a substrate 10 using manufacturing processes similar to those used in microelectronic (e.g., semiconductor) manufacturing. Substrate 10 comprising resonator 42 is singulated out of a mother substrate 20, as illustrated in FIG. 1. The resonator 42 serves as a frequency-selective element in an electrical network 32. The electrical network comprises at least one signal port 34. The resonator 42 is enclosed in a cavity 72 in the substrate 10, as illustrated in FIG. 2, constructed and operative in accordance with an embodiment of the present invention. The thick orthogonal lines in the figures represent electrical connection rather than physical features.

Figures 3A, 3B:
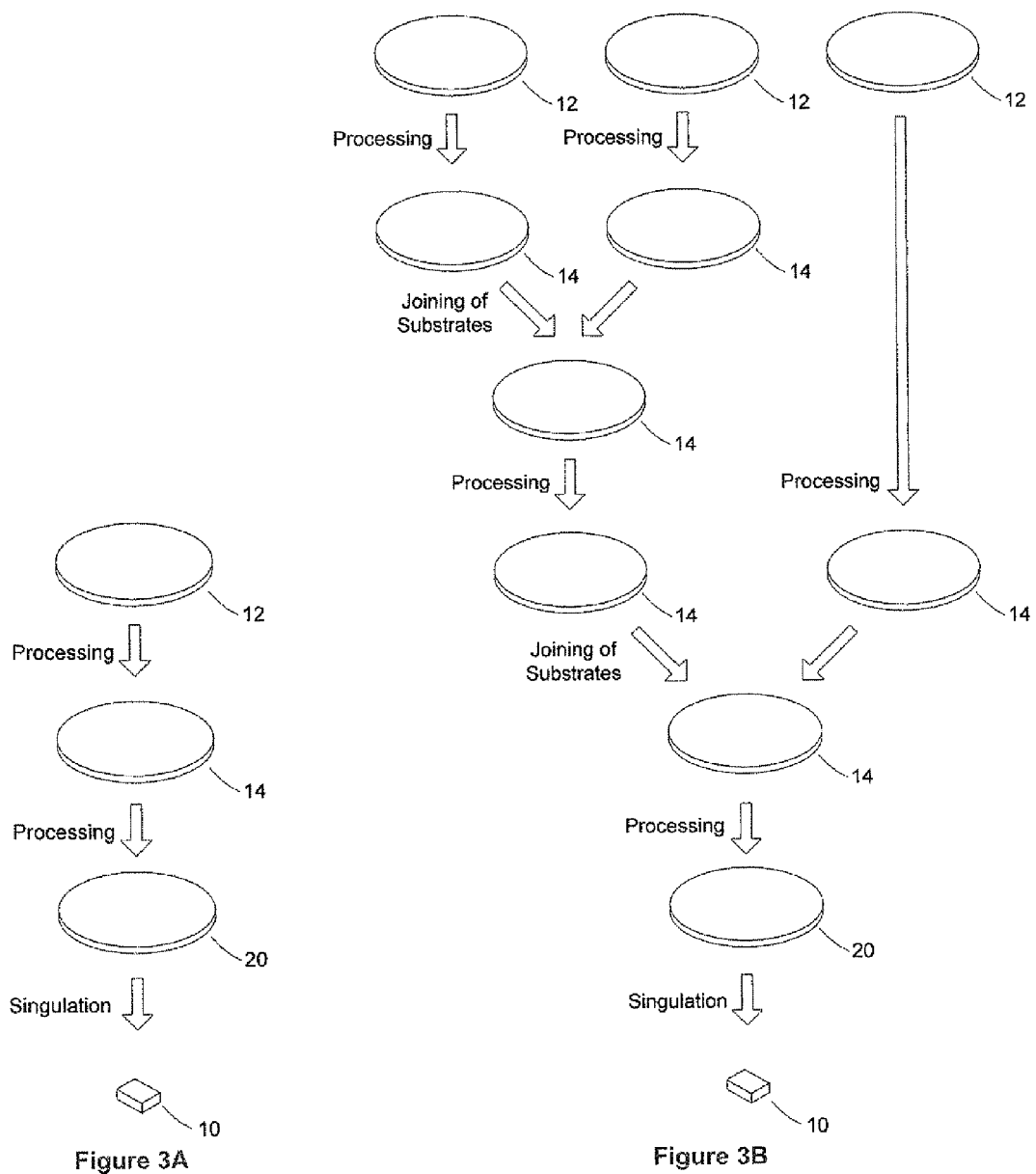
FIG. 3 illustrates the process flow of initial substrate, intermediary substrate, and mother substrate, and singulating mother substrate to obtain final substrate. A process using one initial substrate is illustrated in FIG. 3A. A process using three initial substrates is illustrated in FIG. 3B.

Substrate 10 and mother substrate 20 may be formed by a variety of methods, as illustrated in FIGS. 3A-3B, constructed and operative in accordance with an embodiment of the present invention. The method of manufacturing may use one initial substrate 12, as illustrated in FIG. 3A. Initial substrate 12 has no patterned features. The initial substrate 12 is processed into intermediary substrate 14. The method of manufacturing may use more than one initial substrate 12. A process utilizing three initial substrates 12 is illustrated in FIG. 3B. One or more physical joining processes may be employed to join a plurality of intermediary substrates 14 into a new intermediary substrate 14. As intermediary substrate 14 is further processed, it becomes mother substrate 20 when it is ready to be singulated. Singulating mother substrate 20 yields a plurality of substrate 10. The cavity 72 may be formed during a physical joining process and/or a material addition process.

In one aspect of the present invention, minimizing the lateral dimensions of the substrate 10 with small lateral dimensions may be beneficial. A larger plurality of substrate 10 and resonator 42 may be obtained from one mother substrate 20 when the lateral dimensions of substrate 10 are reduced.

Figure 4:
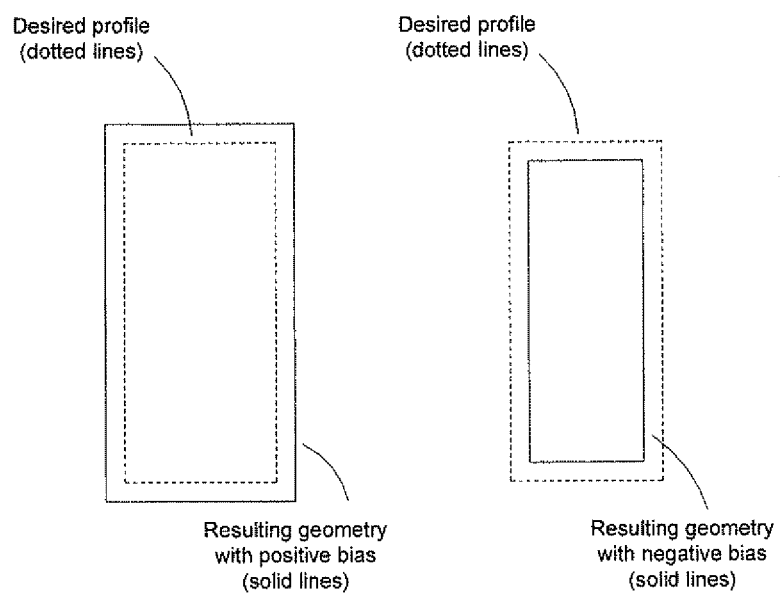
FIG. 4 illustrates top views of features on a substrate comparing the desired profile and the resulting geometry with process variation. One view illustrates positive process bias resulting in a larger-than-desired feature, one view illustrates negative process bias resulting in a smaller-than-desired feature.

In another aspect of the present invention, a resonator design that is insensitive to processing variations is beneficial. The geometry of a micromechanical device is dependent on manufacturing processes such as patterning, material addition, and material removal. A reduced sensitivity to such variations in processes is beneficial. That is, the resonant frequency of the resonator has reduced dependency on the repeatability of the processes. The size of the resulting geometry may be greater or smaller than the desired dimensions, as illustrated in FIG. 4, constructed and operative in accordance with an embodiment of the present invention.

In a further aspect of the present invention, suppression of undesired modes is beneficial. A plurality of resonance modes is common in uniform and symmetric geometries. Introduction of irregularity in the profiles and non-uniformity of the geometries may suppress undesired modes. In general, the profile of a feature is the planar geometry, viewed in the direction along the normal to the majority of disposed films. The normal to the majority of the disposed films commonly coincides with the normal to the substrate.

Basic Resonator Geometry

Figure 5:
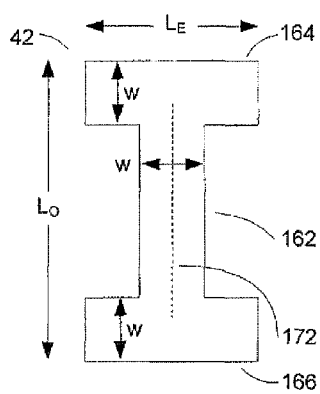
FIG. 5 illustrates two extensional-mode resonator geometries and the design parameters for process compensation.
Figure 5:
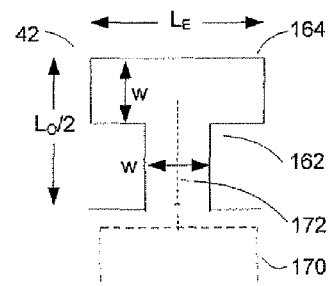
Figure 5:
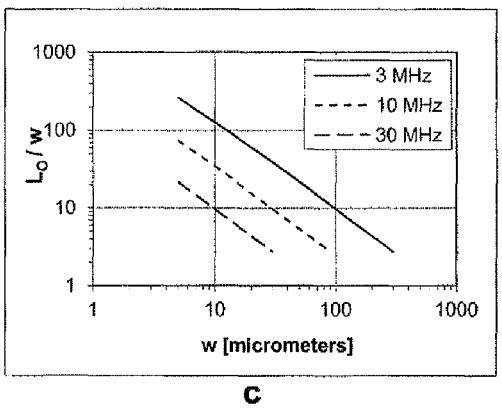
Figure 5:
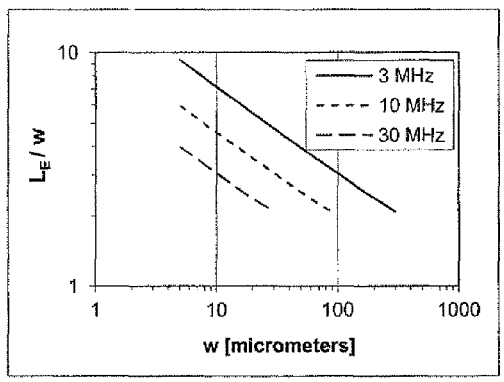

A resonator design that is insensitive to process variations is process compensated. Two resonator geometries that have process-compensated design solutions are illustrated in FIGS. 5A and 5B, constructed and operative in accordance with an embodiment of the present invention. Approximate solutions (i.e., the resonator dimensions) are shown in FIGS. 5C and 5D. The existence of these process-compensated solutions provides evidence that similar designs may also be insensitive to process variations.

In one embodiment, the micromechanical resonator 42 comprises a primary portion 162 and an enlarged portion 164 connected at one end of the primary portion 162, as illustrated in FIG. 6A. Primary portion 162 is further connected to a field 170 region of the substrate 10 to provide mechanical support. The resonator 42 typically requires partial suspension to have high quality factor.

In one aspect of the present invention, the primary portion 162 serves primarily as a stiffness-providing element and the enlarged portion 164 serves primarily as a mass-loading element. A mass-loading element reduces the overall dimension to obtain a desired frequency. Compared to alternative geometries for resonators having the same frequency, the present invention has reduced lateral dimensions, improved isolation of the desired mode, and reduced sensitivity to process variations.

Low sensitivity to process variations is obtained by designing the geometry and size of the enlarged portion 164 and the primary portion 162. A low-sensitivity design has the following attribute: The fractional change to the overall dynamic stiffness of the resonator 42 caused by process variations is similar to the fraction change to the overall dynamic mass.

The Enlarged Portion

Figure 6:
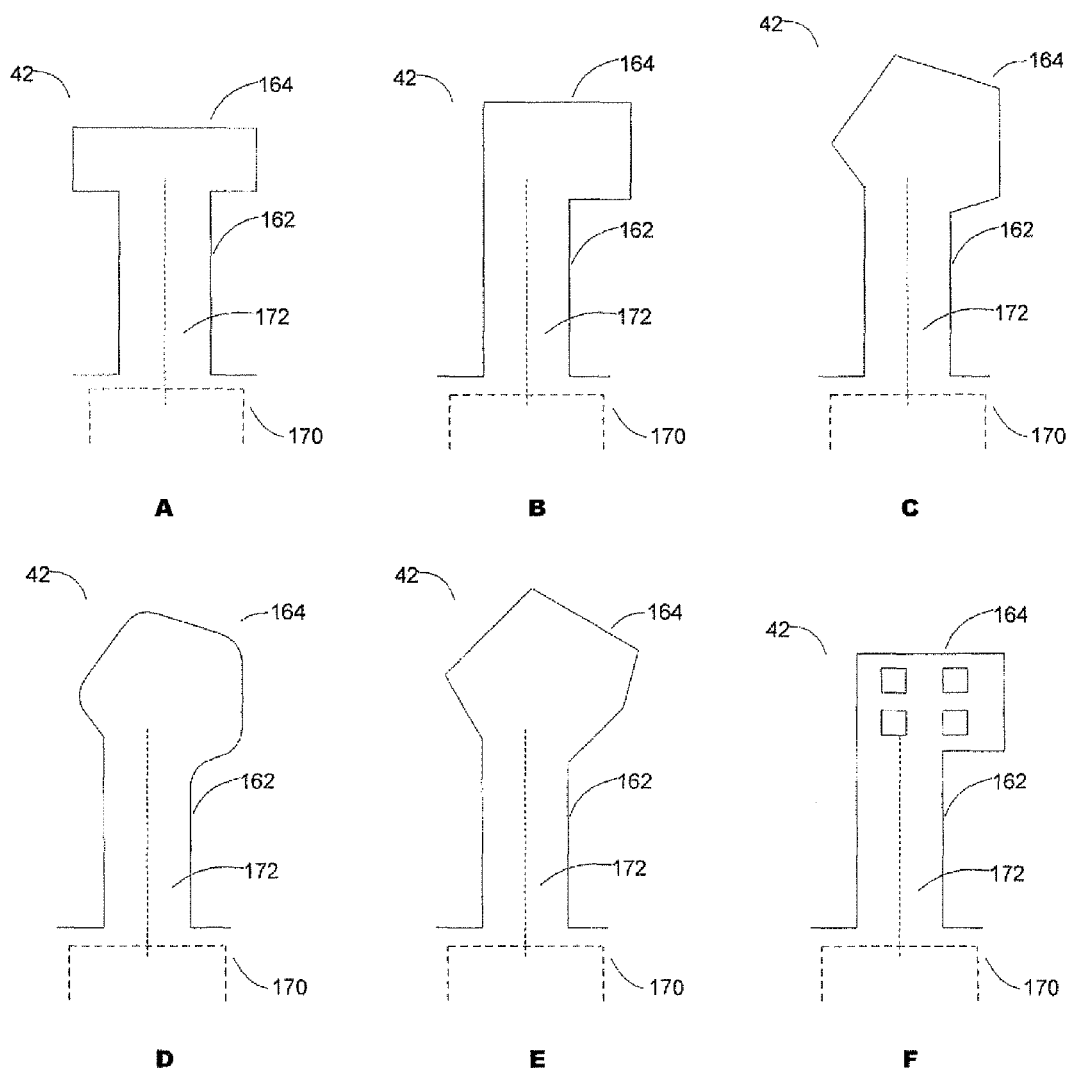
FIG. 6 illustrates top views of resonators having a primary portion, an enlarged portion, and the primary portion is connected directly to the field of the substrate. The resonators have various profiles for the enlarged portion.

Embodiments of the present invention with respect to the enlarged portion 164 are further illustrated in FIG. 6, constructed and operative in accordance with an embodiment of the present invention. An asymmetric and/or irregular profile for enlarged portion 164 may be beneficial for suppressing undesired modes. The enlarged portion 164 may or may not be symmetric about the first major axis 172 of the primary portion 162. The enlarged portion 164 may be rectangular and asymmetrical about the axis 172, as illustrated in FIG. 6B. The enlarged portion 164 may have a geometry resembling a regular polygon, as illustrated in FIG. 6C. The enlarged portion 164 may comprise rounded features and may be an irregular polygon, as illustrated FIG. 6D and FIG. 6E, respectively. The enlarged portion 164 may comprise a circular, ellipsoidal, annular, triangular, or trapezoidal profile. The enlarged portion 164 may be an integral solid feature and may have features internal to its periphery. The enlarged portion 164 may comprise a plurality of holes, as illustrated in FIG. 6F.

The Primary Portion

Figure 7:
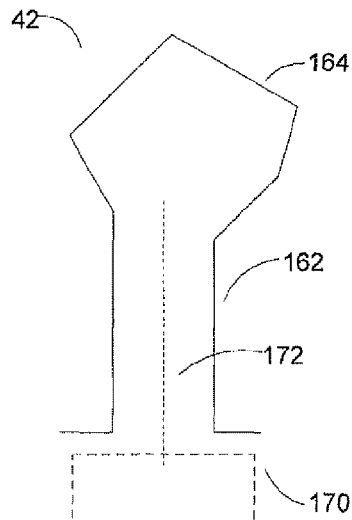
FIG. 7 illustrates top views of resonators having various profiles for the primary portion.
Figure 7:
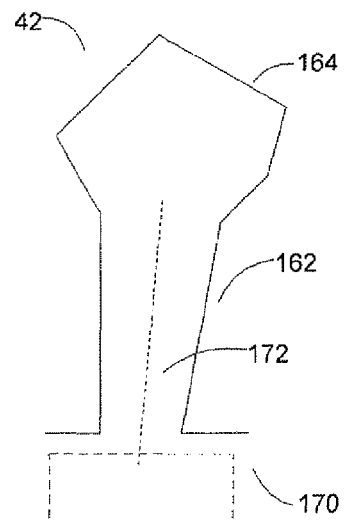
Figure 7:
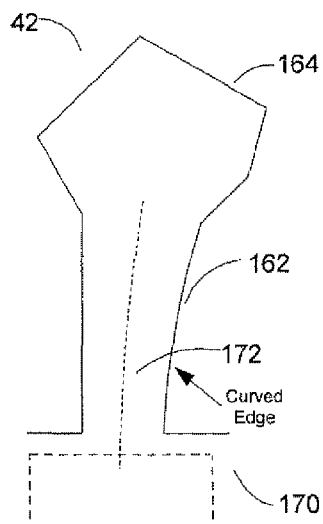
Figure 7:
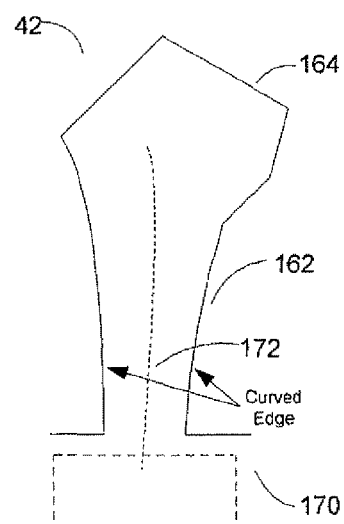
Figure 8:
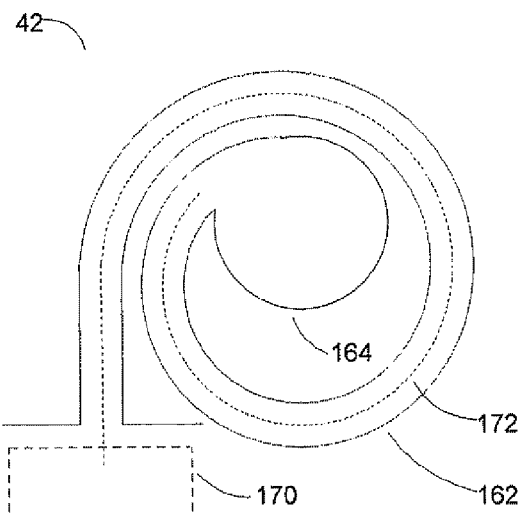
FIG. 8 illustrates a top view of a resonator with a primary portion in the shape of a swiss roll.

Embodiments of the present invention with respect to the primary portion 162 are illustrated in FIG. 7, constructed and operative in accordance with an embodiment of the present invention. The primary portion 162 may have a uniform width along axis 172, as illustrated in FIG. 7A. An irregular profile for primary portion 162 may be beneficial for suppressing undesired modes. The primary portion 162 may have a non-uniform width along axis 172, as illustrated in FIG. 7B. The primary portion 162 may comprise a curved edge, as illustrated in FIG. 7C. The primary portion 162 may consist of no straight (drawn) edges, as illustrated in FIG. 7D. The primary portion 162 may also comprise a trapezoidal, truncated triangular, truncated ellipsoidal, square, truncated annular, or irregular polygonal profile. The primary portion 162 may comprise an internal hole or comprise a plurality of holes. The primary portion 162 may comprise a geometry resembling a swiss roll, as illustrated in FIG. 8, constructed and operative in accordance with an embodiment of the present invention.

Distinguishing the Primary Portion and Enlarged Portion

Figure 9:
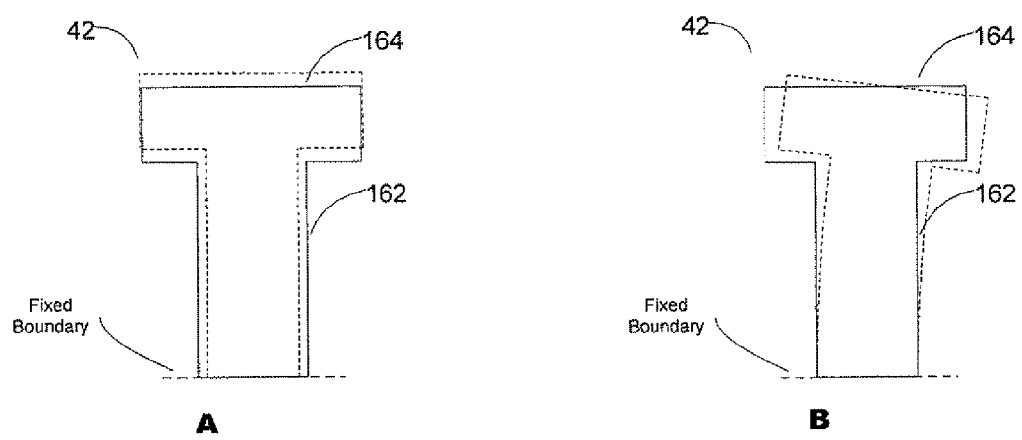
FIG. 9 illustrates top views of the geometry and mode shapes of an extensional-mode resonator and an in-plane-flexural-mode resonator.

The enlarged portion 164 and the primary portion 162 in a resonator 42 are best identified by their function in the desired resonant mode as shown in FIGS. 9A and 9B, constructed and operative in accordance with an embodiment of the present invention. The desired mode may be bulk extensional, as illustrated in FIG. 9A, in-plane flexural, as illustrated in FIG. 9B, out-of-plane flexural, torsional, shear, or combinations thereof. In all the modes, the stiffness is determined primarily by the primary portion 162. The enlarged portion 164 serves primarily as a mass-loading element, although some deformation (i.e., strain) may exist within enlarged portion 164.

Figure 10:
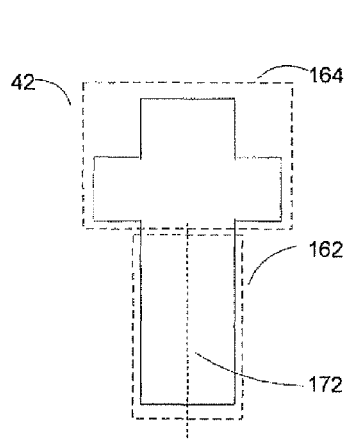
FIG. 10 through FIG. 12 illustrates top views of resonators having additional features in the enlarged portion.
Figure 11:
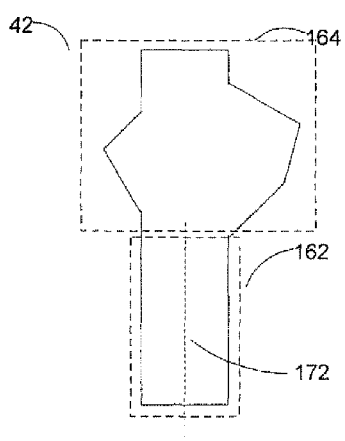
Figure 12:
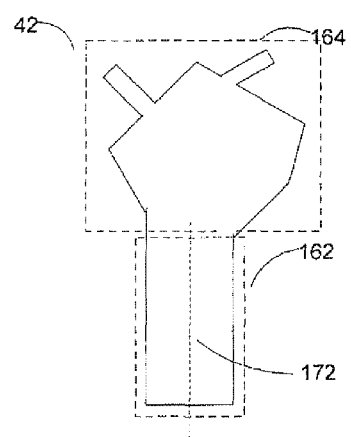

The enlarged portion 164 may comprise an irregular profile with many line segments. The enlarged portion 164 may comprise a feature that resembles a continuation of primary portion 162, as illustrated in FIG. 10 and FIG. 11, constructed and operative in accordance with an embodiment of the present invention. The enlarged portion 164 may comprise features extending from its bulk, as illustrated in FIG. 12, constructed and operative in accordance with an embodiment of the present invention. As the stiffness of such features do not significantly contribute to the stiffness of the mode, the feature is considered part of enlarged portion 164. That is, if the strain energy in the feature is less than 10% of the strain energy of the desired mode, the feature is considered part of enlarged portion 164. The enlarged portion 164 may contain up to 25% of the strain energy of the desired mode of operation.

Connection to the Field of the Substrate

Figure 13:
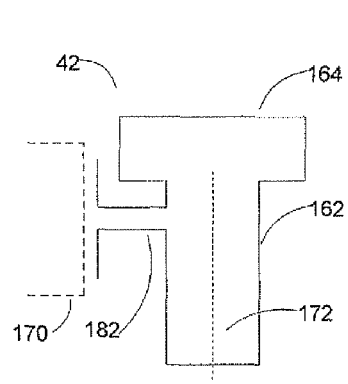
FIG. 13 illustrates top views of resonators connected to the field through a tether.
Figure 13:
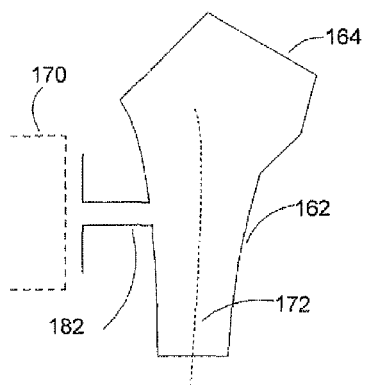
Figure 14:
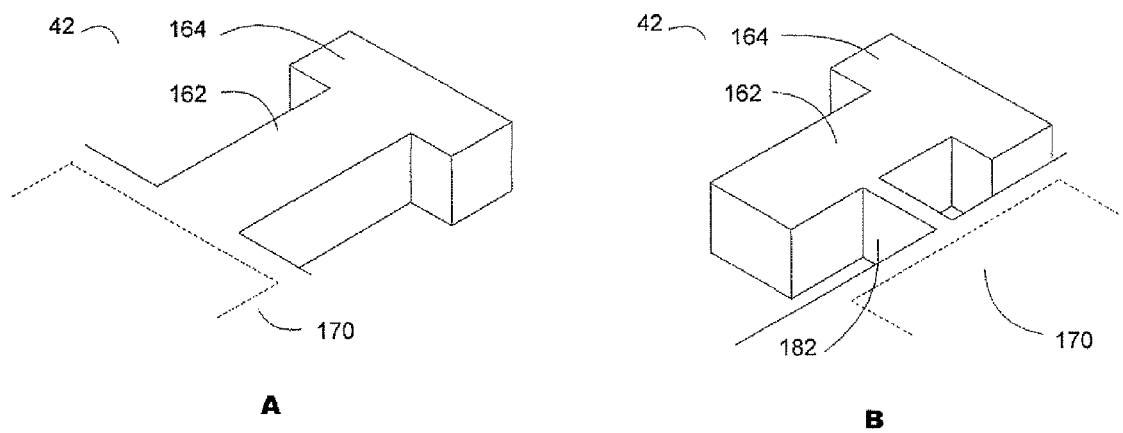
FIG. 14 illustrates perspective views of a resonator connected directly to the field and a resonator connected to the field through a tether.

The resonator may be attached to the field 170 in a variety of methods. The field 170 is an integral part of the substrate 10. Connection to the field 170 is required to provide mechanical support of resonator 42 in substrate 10 and to provide electrical connection to one or more signal port 34. In one embodiment, the primary portion 162 is directly connected to the field 170 at the end of axis 172 opposite to enlarged portion 164, as illustrated in FIG. 6 and FIG. 7. Connection of the primary portion 162 to the field 170 provides a method of partially-suspending resonator 42 in substrate 10. In another embodiment, resonator comprises a tether 182 to connect to the field 170, as illustrated in FIG. 13, constructed and operative in accordance with an embodiment of the present invention. As the primary portion 162 may have any profile while maintaining its characteristic attributes, the geometry of tether 182 may be considered part of primary portion 162 rather than a separate feature. Although tether 182 may have some motion in the mode shape, it primarily serves as a mechanical connection. A tether 182 is further defined to have less than 10% of the modal energy in the desired mode of operation. Embodiments may comprise a plurality of tether 182.

A Second Enlarged Portion

Figure 15:
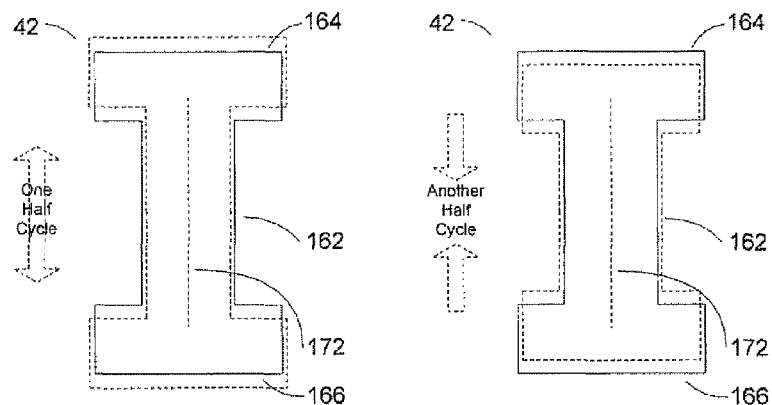
FIG. 15 illustrates the top view and mode shape of a resonator including a second enlarged portion.
Figure 16:
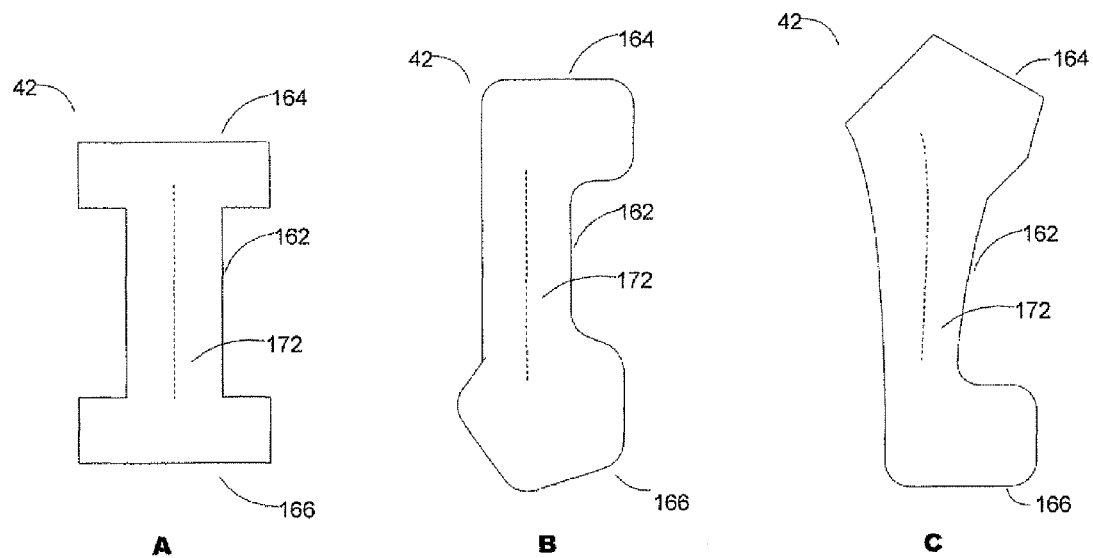
FIG. 16 illustrates top views of resonators with various profiles for the enlarged portion and second enlarged portion.
Figure 17:
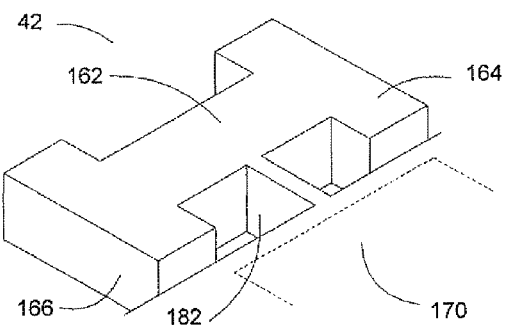
FIG. 17 illustrates a perspective view of a resonator having an enlarged portion and a second enlarged portion and the primary portion is connected to the field through a tether.
Figure 18:
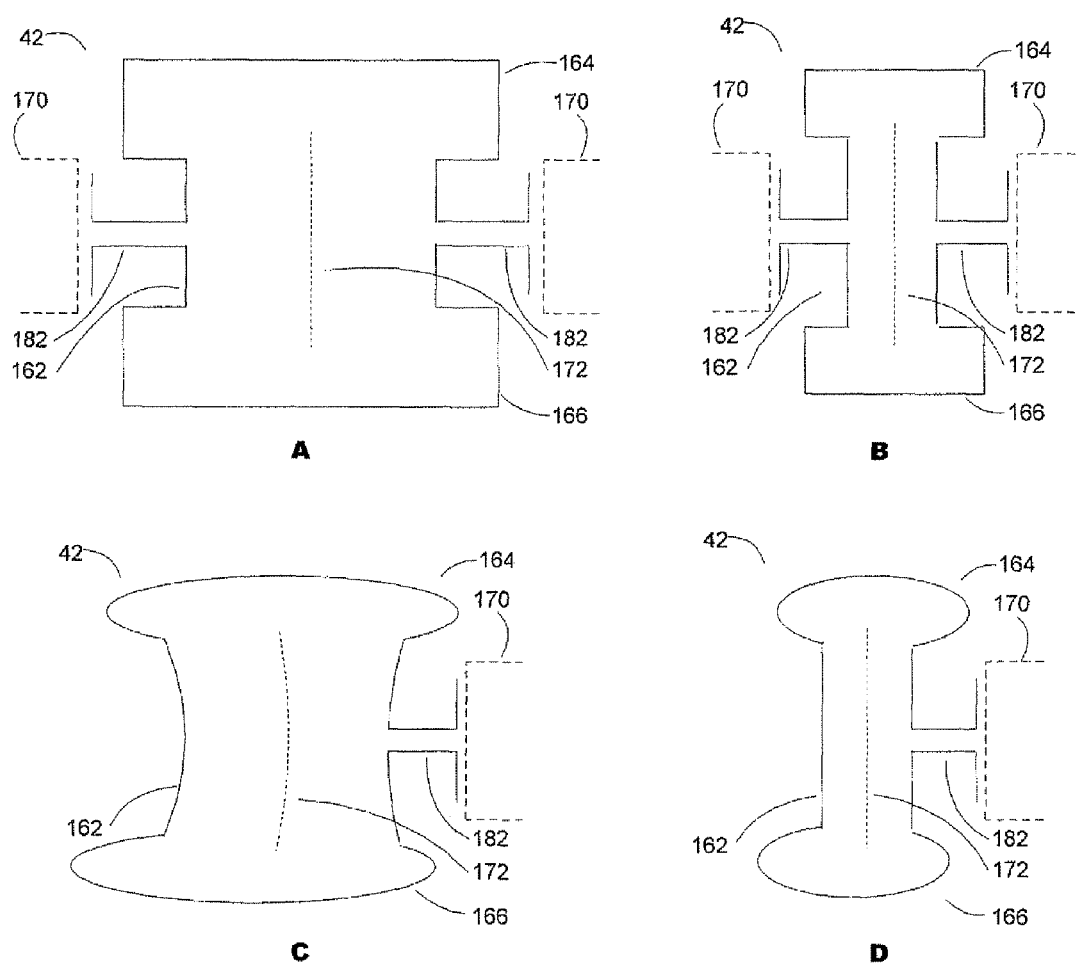
FIG. 18 illustrates top views of a resonator including a second enlarged portion.

A second enlarged portion 166 connected to primary portion 162 may be beneficial in providing symmetry in the resonator 42. Disposing second enlarged portion 166 and enlarged portion 164 at the two distal ends of axis 172 provides greatest symmetry, as illustrated in FIG. 15, constructed and operative in accordance with an embodiment of the present invention. In one embodiment, second enlarged portion 166 may be symmetrical to enlarged portion 164, as illustrated in FIG. 16A. In another embodiment, second enlarged portion 166 may not be symmetrical to enlarged portion 164, as illustrated in FIG. 16B and FIG. 16C. In a further embodiment, the resonator 42 comprising a primary portion 162, an enlarged portion 164, and a second enlarged portion 166 may be attached to the field 170 through a tether 182, as illustrated in FIG. 17, constructed and operative in accordance with an embodiment of the present invention. One or more tethers may be used to connect primary portion 162 to the field 170. Embodiments of resonator 42 including a second enlarged portion 166 are illustrated in FIG. 18, constructed and operative in accordance with an embodiment of the present invention.

Plurality of Primary Portions

Figure 19:
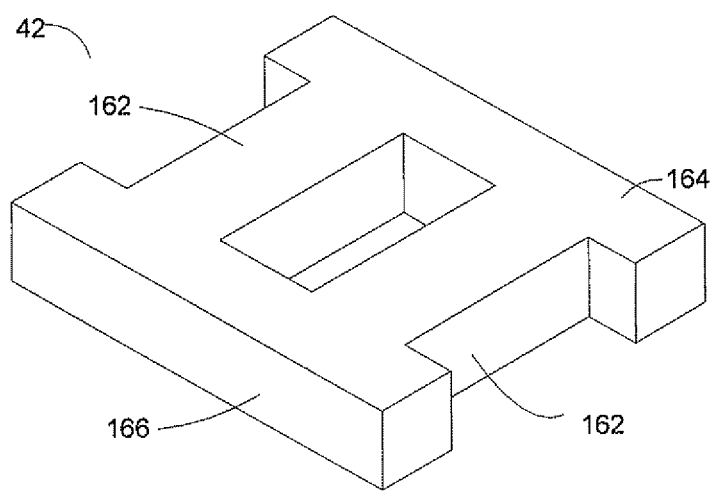
FIG. 19 illustrates a perspective view of a resonator comprising a plurality of primary portions.

A plurality of primary portions 162 may be beneficial for increasing the resonator electrode area for improved electrical performance. An embodiment comprising two primary portions 162, wherein each primary portion 162 is connected to an enlarged portion 164 and a second enlarged portion 166, is illustrated in FIG. 19, constructed and operative in accordance with an embodiment of the present invention.

Substrates

Substrates, especially those used in advanced manufacturing, commonly comprise semiconductor materials, piezoelectric materials, glass, ceramics, and other materials. Bonding a plurality of substrates of similar or differing materials produces a substrate that can then be processed as a single substrate. Furthermore, substrates are amenable to have materials deposited on their surface. For example, some regions of a substrate may be formed by chemical vapor deposition, physical vapor deposition, epitaxial growth, atomic layer deposition, electro-chemical plating, various forms thereby, and other additive processes. Substrates are also amenable to have materials removed from the bulk of the substrate or from the disposed films. The normal of a substrate is the direction perpendicular to the disposed films. The disposed films are commonly parallel to the major surfaces.

The definition of substrate and assemblies precluded from being a substrate are discussed. Physically joining a plurality of substrates with similar lateral profile yields a newly-formed substrate. An assembly of substrates with dissimilar outer profiles is not a substrate. An assembly that is further processed continues to be an assembly and is no longer a substrate.

Resonator Composition and Construction

We now move to FIGS. 20A-20F, constructed and operative in accordance with an embodiment of the present invention. Resonator 42 may be constructed using any known resonator technologies, including but not limited to quartz technology, piezoelectric resonator technology, surface-micromachined capacitive resonator technology, bulk capacitive resonator technology, and any combination thereof. In one embodiment, resonator 42 comprises first conductive film 204, piezoelectric material 202, second conductive film 206, and compensating material 208, as illustrated FIG. 20A. First conductive film 204, piezoelectric material 202, and second conductive film 206 form the piezoelectric stack. A first electrode 194 and a second electrode 196 may have the same profile as resonator 42. Compensating material 208 has a positive acoustic velocity temperature coefficient to compensate the commonly negative temperature coefficient of the acoustic velocity of most materials. Compensating material 208 and piezoelectric stack may be engineered to form the resonator 42 with a temperature-stable resonant frequency. Compensating material 208 may be silicon dioxide. Piezoelectric material 202 may be selected from the group including, but not limited to, quartz, aluminum nitride, zinc oxide, lead zirconium titanate (PZT), lithium niobate, lithium tantalite, langasite, and barium titanate. Piezoelectric material 202 may be a part of an initial substrate (i.e., a bulk material) or a disposed film. Materials for conductive electrode films may be selected from the group of conductive materials commonly used in semiconductor, quartz resonator, SAW resonator, and film BAW resonator manufacturing.

Figure 20:
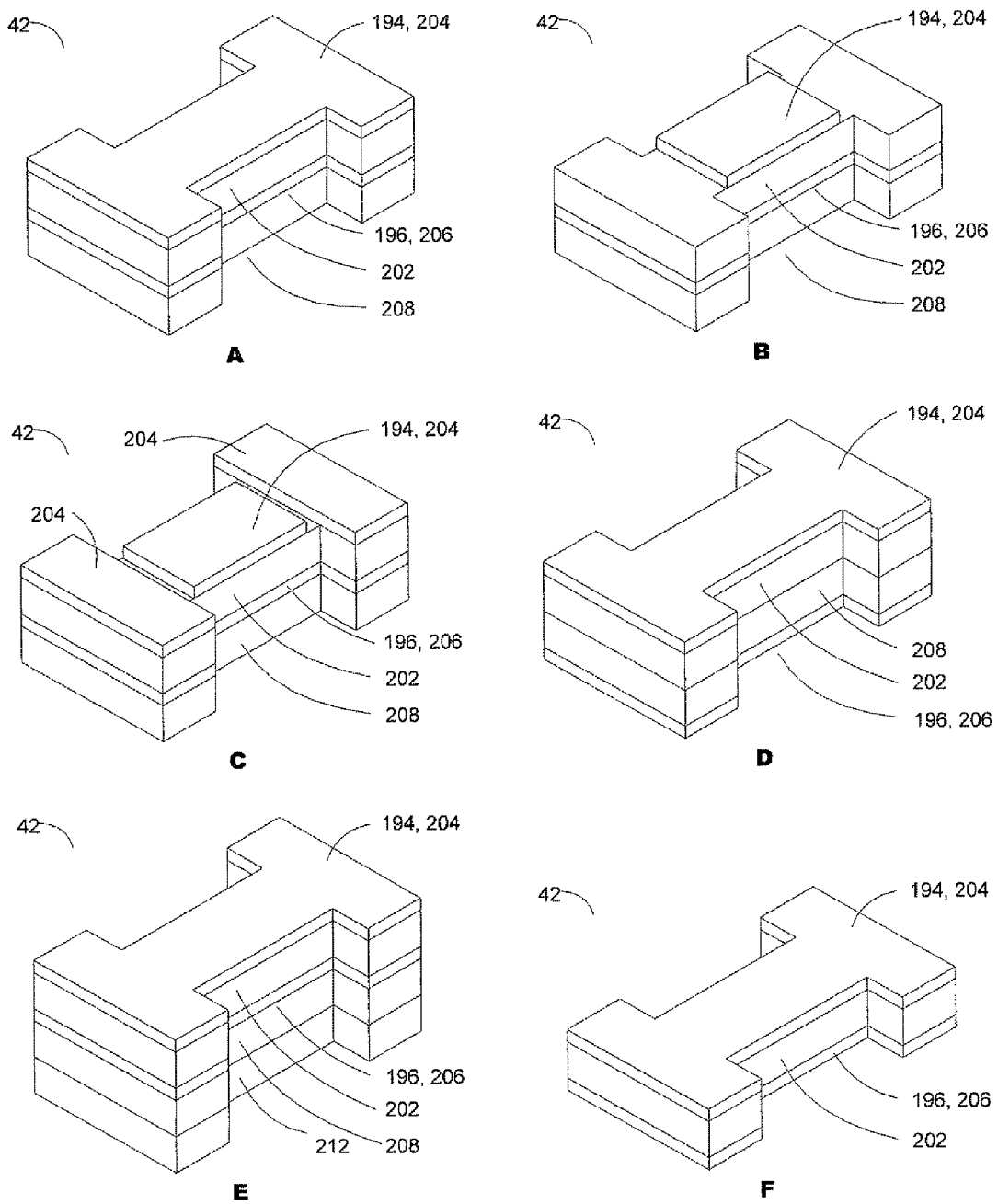
FIG. 20 illustrates perspective views of resonators comprising a piezoelectric film and a conductive film. Some resonators include a compensating material and/or a structural material.

The first electrode 194 may be patterned out of the first conductive film 204, as illustrated in FIG. 20B and FIG. 20C. First conductive film 204 may nominally cover the entire resonator 42 and have disjointed regions that are not electrically connected to the first electrode 194. The second electrode 196 may be similarly patterned in the second conductive film 206.

The compensating material 208 may be disposed within the piezoelectric stack, as illustrated in FIG. 20D.

In another embodiment, resonator 42 comprises first conductive film 204, piezoelectric material 202, second conductive film 206, compensating material 208, and structural material 212 such as single crystal silicon, as illustrated in FIG. 20E. Structural material 212 provides the benefit of structural integrity and mode shape optimization. The structural material 212 and/or compensating material 208 may be disposed in the piezoelectric sta.

In another embodiment, resonator 42 comprises first conductive film 204, piezoelectric material 202, and second conductive film 206, as illustrated in FIG. 20F. Piezoelectric material 202 may be a particular cut of quartz with a desired temperature-dependent characteristic of its acoustic velocity. Compensating material 208 is not necessary in an embodiment such as a quartz resonator that is self-compensated.

In another embodiment, resonator 42 comprises first conductive electrode film 204 and piezoelectric material 202. First electrode 194 and second electrode 196 may be patterned out of one conductive film, such as in a SAW resonator.

In a further embodiment, resonator 42 comprises first conductive electrode film 204, piezoelectric material 202, and compensating material 208.

Electrical Network

Figure 21A:
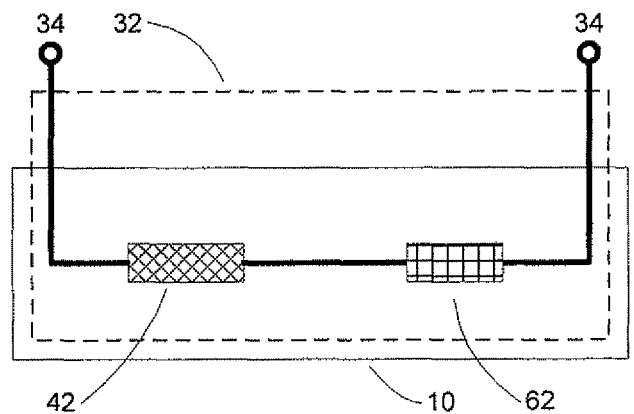
FIG. 21 illustrates cross-sectional views of the substrate comprising an electrical network further comprising a capacitor formed on the substrate and connected in series to the resonator.
Figure 21B:
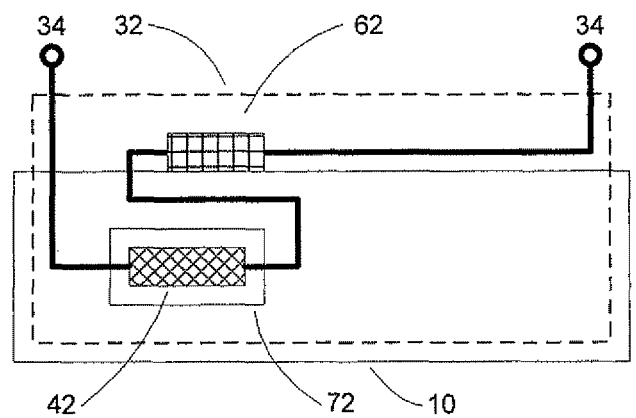

The electrical network 32 may comprise a capacitor 62 formed on substrate 10 and connected in series to resonator 42, as illustrated in FIG. 21A. Capacitor 62 may be desired to have a large capacitance compared to the static capacitance of resonator 42. Additionally, the lateral dimensions of substrate 10 may be desired to be as small as possible. Capacitor 62 may be a solid-dielectric capacitor. The dielectric in capacitor 62 may be the same material as the piezoelectric material in resonator 42. The piezoelectric material disposed as a dielectric in capacitor 62 may have the same thickness as the piezoelectric material disposed in resonator 42. The piezoelectric material disposed as a dielectric in capacitor 62 may have reduced thickness to the piezoelectric material disposed in resonator 42. In one embodiment, capacitor 62 may be formed out of one or more of materials used to form resonator 42. In another embodiment, capacitor 62 may be formed entirely of the materials used to form resonator 42. In a further embodiment, capacitor 62 may be disposed on substrate 10 and is overlapping resonator 42 when viewed normal to the disposed films, as illustrated in FIG. 21B.

Figure 22A:
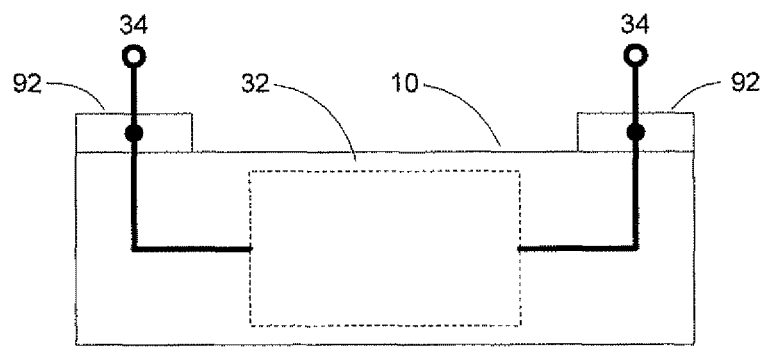
FIG. 22 illustrates cross-sectional views of the application of the electrical network in the field of use.
Figure 22B:
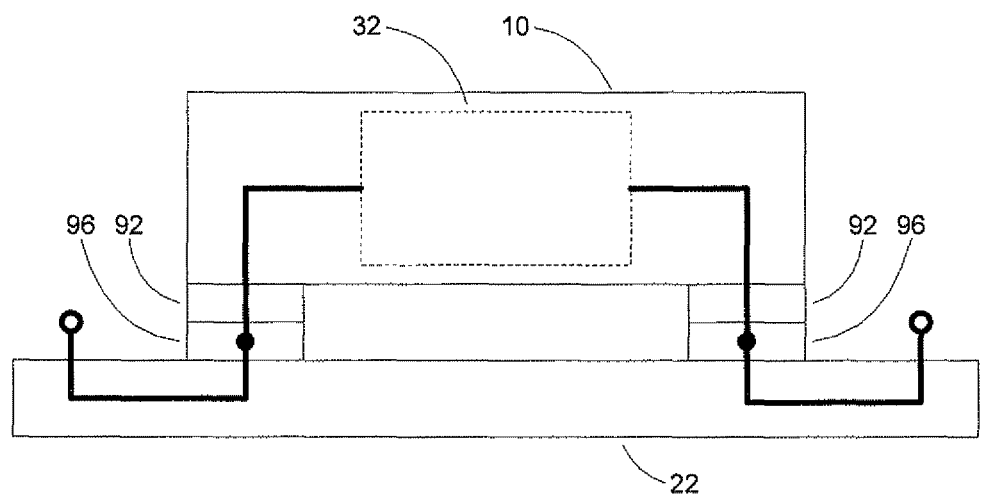

In one embodiment, substrate 10 further comprises two electrical contacts 92 for external electrical connection to network 32, as illustrated in FIG. 22A. In a further embodiment, electrical network 32 is electrically connected to a carrier substrate 22 through electrical contacts 92 and solder connections 96, as illustrated in FIG. 22B.

What is claimed is:

1. An apparatus comprising:
a substrate comprising an electrical network,
the electrical network further comprising:
a micromechanical acoustic resonator formed on the substrate and enclosed in a cavity in the substrate, the resonator is partially suspended in the cavity, the resonator comprising a piezoelectric material, a conductive material, a primary portion, and a first enlarged portion, the primary portion is connected to the substrate, and
the first enlarged portion is connected to one end of the primary portion, wherein the first enlarged portion has an irregular profile.

2. The apparatus according to claim 1,
the electrical network further comprising a capacitor, the capacitor connected in series to the resonator.

3. The apparatus according to claim 2,
wherein the series capacitor is located external to the cavity of the resonator.

4. The apparatus according to claim 1,
wherein a desired mode of the resonator is predominantly in the plane of the substrate and has a secondary motion in the direction normal to disposed films.

5. The apparatus according to claim 1,
wherein the primary portion has predominantly extensional motion in a desired mode of the resonator.

6. The apparatus according to claim 1,
wherein the primary portion has predominantly flexural motion in a desired mode of the resonator.

7. The apparatus according to claim 4,
wherein a profile of the first enlarged portion is asymmetric about a first major axis of the primary portion.

8. The apparatus according to claim 1,
the resonator further comprises a second enlarged portion, the first and second enlarged portions located at distal ends of the primary portion.

9. The apparatus according to claim 1,
wherein the primary portion is directly connected to the substrate.

10. The apparatus according to claim 1, the resonator further comprising:
a tether connecting the primary portion to the substrate.

11. An apparatus comprising:
a micromechanical acoustic resonator formed on a substrate and enclosed in a cavity in the substrate, the resonator being partially suspended in the cavity, the resonator is shaped with a primary portion, and a first enlarged portion, where the primary portion is connected to the substrate, and the first enlarged portion is connected to one end of the primary portion;
a capacitor connected in series to the resonator, the capacitor being located external to the cavity;
wherein the resonator is made of a piezoelectric material in between a first conductive film and a second conductive film and a compensating material; and
wherein the first enlarged portion has an irregular profile.

12. The apparatus according to claim 11, the resonator further comprising:
a second enlarged portion, the second enlarged portions located at a distal end of the primary portion opposite from the first enlarged portion.

13. The apparatus according to claim 11,
wherein a desired mode of the resonator is predominantly in the plane of the substrate and has a secondary motion in the direction normal to disposed films.

14. The apparatus according to claim 11,
wherein the primary portion has predominantly extensional motion in a desired mode of the resonator.

15. The apparatus according to claim 10,
wherein the primary portion has predominantly flexural motion in a desired mode of the resonator.

16. The apparatus according to claim 11,
wherein a profile of the first enlarged portion is asymmetric about a first major axis of the primary portion.

17. The apparatus according to claim 11,
the resonator further comprises a second enlarged portion, the first and second enlarged portions located at distal ends of the primary portion.

18. The apparatus according to claim 11, wherein the primary portion is directly connected to the substrate.

19. The apparatus according to claim 11, the resonator further comprising:
a tether connecting the primary portion to the substrate.

* * * * *